US006541399B1

United States Patent
Hung et al.

(10) Patent No.: US 6,541,399 B1
(45) Date of Patent: Apr. 1, 2003

(54) SABPSG PROCESS REAL TEMPERATURE MONITOR

(75) Inventors: Mong-Chi Hung, Douliou (TW); Pin-Huan Wu, Hsinchu (TW); Cheng-Lung Yang, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/967,721

(22) Filed: Oct. 1, 2001

(51) Int. Cl.[7] ............................................. H01L 21/469
(52) U.S. Cl. ..................................................... 438/783
(58) Field of Search ........................... 438/14, 58, 783; 118/697

(56) References Cited

U.S. PATENT DOCUMENTS

| | | | |
|---|---|---|---|
| 5,963,840 A | * 10/1999 | Xia | ............................ 438/783 |
| 6,126,744 A | 10/2000 | Hawkins et al. | ............... 117/85 |
| 6,136,388 A | 10/2000 | Raoux et al. | ................ 427/569 |
| 6,156,149 A | 12/2000 | Cheung et al. | .......... 156/272.2 |
| 6,162,709 A | 12/2000 | Raoux et al. | ............... 438/513 |
| 6,348,099 B1 | * 2/2002 | Xia | ............................ 118/697 |

* cited by examiner

Primary Examiner—John F. Niebling
Assistant Examiner—Andrée C. Stevenson
(74) Attorney, Agent, or Firm—George O. Saile; Stephen B. Ackerman

(57) ABSTRACT

A new method is provided of measuring actual temperatures across the surface of a semiconductor wafer. The thickness of a layer of Sub-Atmospheric TEOS Undoped Silicon Glass (SAUSG) is used to monitor the temperature distribution across the surface of a silicon substrate.

19 Claims, 1 Drawing Sheet

SABPSG PROCESS REAL TEMPERATURE MONITOR

BACKGROUND OF THE INVENTION (1). Field of the Invention

The invention relates to the fabrication of integrated circuit devices, and more particularly, to a method to improve temperature control of a wafer that is being processed and to therewith improve process uniformity.

(2). Description of the Prior Art

One of the more important control parameters that is applied during the processing of semiconductor devices is the temperature of the wafer. Thermally controlled processing procedures that are part of creating a semiconductor device include for instance thermal oxidation, dopant diffusion, epitaxy and thermal annealing, nitridation, the process of forming salicided surfaces, methods of Chemical Vapor Deposition (CVD) and the like. The process of CVD is widely applied in for instance the formation of dielectric layers containing oxides and nitrides, the creation of layers of amorphous silicon and polysilicon and for the creation of conductive layers of metal that are subsequently patterned and etched to form metal interconnect lines.

The above cited semiconductor procedures and others are highly temperature dependent, which leads to the requirement of good temperature control during the performance of these procedures. This temperature control can be implemented using a variety of methods. For instance, exposing both surfaces of a wafer to heating lamps that are part of a thermal reactor. By adjusting a controller of the thermal reactor, a control that can be implemented via the implementation of a closed loop feedback mechanism that is driven by the measured temperature of the wafer, adjustments can be made to the heating lamps in order to provide the desired temperature of the wafer that is being processed.

Another method that can be applied for the control of the temperature of a semiconductor wafer is to place the wafer over the surface of a heater or heated pedestal, heating a first surface of the wafer. Gasses that are deposited on the second surface of the wafer are released through multiple openings in a cover plate, which can further be used for heating the second surface of the wafer. In using this arrangement, it is clear that thermal coupling between the temperature controlling elements of the arrangement, that is the heated pedestal and the cover plate, must be uniform and equally distributed over the first and the second surface of the wafer. Any interruptions in this thermal coupling with either the first or the second surface of the wafer leads to undesirable gradients of temperature distribution over the surface of the wafer and must therefore be avoided. Due to the elevated temperatures of the heated pedestal and the cover plate, these elements of the heating arrangement tend to warp which introduces into this method of heating exactly those conditions of heating that are to be avoided for the reasons stated. In applying the method of heating a wafer where a heated pedestal and the cover plate are applied, a better method must therefore be provided to control how the heat is applied to the wafer and the effectiveness of this heat application. The invention provides such a method by observing parameters of thickness of a layer of deposited material on the surface of the substrate and by using these parameters of thickness as a gauge of the actual conditions of temperature across the face of the wafer.

U.S. Pat. No. 6,136,388 (Raoux) and U.S. Pat. No. 6,162,709 (Raoux et al.) show AMAT centura and describe cover plates.

U.S. Pat. No. 6,126,744 (Hawkins) and U.S. Pat No. 6,156,149 (Cheung et al.) are related patents.

SUMMARY OF THE INVENTION

A principle objective of the invention is to provide an accurate and dependable method of monitoring the temperature profile over the surface of a semiconductor substrate.

Another objective of the invention is to provide a method of controlling temperature over the surface of a semiconductor substrate whereby concerns of warpage of heating elements are eliminated.

Yet another objective of the invention is to provide a method of controlling temperature over the surface of a semiconductor that is easy to implement and easy to control.

A still further objective of the invention is to provide a method of controlling temperature over the surface of a semiconductor that assures good gap filling of deposited layers of dielectric, specifically a layer of sub-atmospheric tetra-ethyl-ortho-silicate-ozone BPSG (SABPSG).

In accordance with the objectives of the invention a new method is provided of measuring actual temperatures across the surface of a semiconductor wafer. The thickness of a layer of Sub-Atmospheric TEOS Undoped Silicon Glass (SAUSG) is used to monitor the temperature distribution across the surface of a silicon substrate.

DESCRIPTION OF THE PREFERRED EMBODIMENTS

Figure 1:
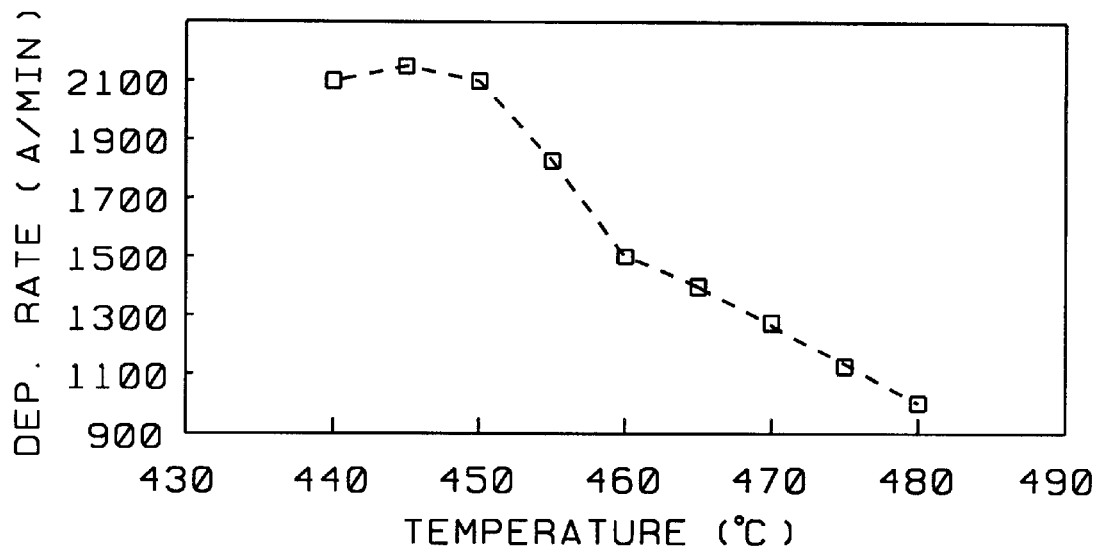
FIG. 1 shows a graph of the relation between the deposition rate of SAUSG and the temperature of deposition.

Borophosphosilicate glass (BPSG) has been widely used as a pre-metal dielectric in ULSI manufacturing. With device topography showing a higher aspect ratio and with thermal budget constraints requiring lower reflow temperatures, sub-atmospheric tetra-ethyl-ortho-silicate-ozone BPSG (SABPSG) becomes an ideal film to achieve requirements of deposition of a pre-metal layer of dielectric. SABPSG has desired deposition properties such as excellent gap fill, low reflow temperatures, no dependency on the pattern of the thereover-patterned layer of metal and high production throughput. The process of creating a layer of pre-metal dielectric using the SABPSG process is typically applied in the creation of logic and memory semiconductor devices. A typical production application can for instance use the commercially available AMAT Centura DxZ system for the deposition of a layer of SABPSG, at a temperature of about 480 degrees C., using an aluminum heater and an aluminum nitride cover plate. Due to the high processing temperatures, the heater and cover plate are subject to warpage, which becomes more pronounced as more wafers are processed without replacing the heater and cover plate. This warpage causes poor contact between the wafer, the heater and the cover plate. This warpage will in addition result in lower than normal processing temperatures across the face of the wafer. The SABPSG process temperature is the most important parameter that controls the SABPSG deposition rate and the SABPSG initial film quality. Lower SABPSG processing temperatures result in a higher SABPSG deposition rate, causing poor gap filling capability and typically resulting in a degradation of the initial film deposition. A suitable method must therefore be provided to monitor and quantify the above-cited warpage, allowing for improved methods of depositing a layer of SABPSG.

The invention uses the thickness of the created layer of SABPSG as an index of the temperature distribution over the surface of a substrate. This temperature distribution over the surface of a substrate is a direct indication of the thermal performance of the heater and the cover plate that are used to create the elevated temperatures across the surface of the substrate. Experimental results have indicated that a thicker layer of SABPSG is indicative of a lower processing temperature in the surface area where the layer of SABPSG has been created. This in turn is indicative of a less efficient heat transfer from the heater and the cover plate to the substrate in the surface area where the layer of SABPSG is created. The less efficient heat transfer is most likely attributable to warpage of the heater or the cover plate or both. The referred to experiments have been performed using a SABPSG deposition rate of about 550 Angstrom per minute, this so that processing temperatures of about 480 degrees C. can be maintained. A relatively low deposition rate is required in order to obtain acceptable gap filling performance of the deposited layer of SABPSG. At temperatures below 480 degrees C., the concentration of free boron (B) and phosphate (P) elements in the deposited SABPSG exceeds acceptable limits. These elements can out-gas during a subsequent BPSG anneal and are, additionally, prone to penetrate exposed surfaces of gate oxide, causing concerns of quality of the layer of gate oxide.

A number of experiments have been performed in support of the invention. For purposes of these experiments:

18 substrates have been used a ceramic heater has been used 9 different temperatures have been applied during the experiments with temperature set points of 440, 445, 450, 455, 460, 465, 470, 475 and 480 degrees C.

two different spacings of 352 and 360 mils have been applied between the heater and the substrate processing conditions in force during the indicated experiments: process time 113 seconds, pressure 200 Torr, $O_3$ supplied at 4,000 sccm, He supplied at 6,000 sccm, TEOS supplied at 500 mgm, a spacing between the substrate and the cover plate of 240 mils.

The above-indicated conditions of experiment were established for each experiment, before and at the end of each experiment the SABPSG deposition rate was measured. This SABPSG deposition rate is used by the invention to determine that actual temperature of the substrate at the surface region where the layer of SABPSG is deposited.

The experimental results that have been obtained performing the above-cited experiments are shown in graphic form in FIG. 1. It must thereby be remembered that it is the objective of the process of depositing a layer of SABPSG to deposit this layer at a relatively low deposition rate so that the desired deposition properties (excellent gap fill, low reflow temperatures, no dependency on the pattern of the thereover patterned layer of metal and high production throughput) can be achieved.

Figure 2:
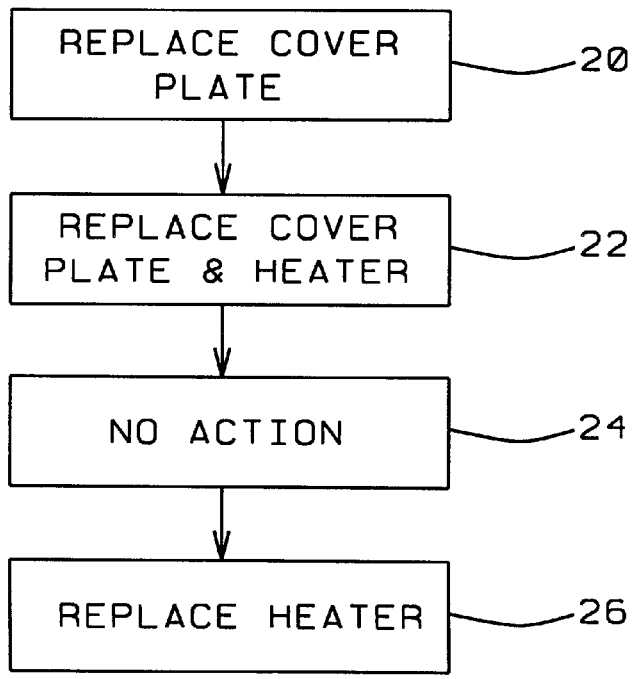
FIG. 2 shows a flow chart of a sequence of experiments that have been performed in support of the invention.

Further experiments have been performed, these experiments having as objective to evaluate the impact of modifying the process application of the substrate cover plate and heater used for the deposition of a layer of SAUSG. Processing conditions have not been modified during these latter experiments. These experiments comprising:

action #1 (A1), FIG. 2, step 20: replacing the cover plate of the substrate action #2 (A2), FIG. 2, step 22: replacing the cover plate and the heater of the substrate action #3 (A3), FIG. 2, step 24: no intervention, and action #4 (A4), FIG. 2, step 26: replacing the heater of the substrate.

For the latter experiments, a ceramic heater has been used since a ceramic heater provides direct contact with the wafer and has better thermal conductivity. These latter experiments have led to the following results as shown in table form below. Column #1 shows the SAUSG deposition rate in Angstrom/minute before replacing a part, column #2 shows the particular action of part replacement that has been taken in accordance with the prior defined sequences of actions A1 through A4, column #3 shows the SAUSG deposition rate in Angstrom/minute after the corresponding action has been completed, as follows:

| #1 | #2 | #3 |
|------|----|------|
| 1589 | A1 | 1433 |
| 1578 | A2 | 1092 |
| 1374 | A3 | 1418 |
| 1381 | A4 | 1424 |

The receding experiments have led to the following conclusions:

1. by monitoring the deposition rate of the deposited layer of SAUSG, the temperature of the surface over which the layer of SAUSG is deposited can be monitored, and 2. by replacing warped parts such as the substrate heater and/or the cover plate, the temperature of the surface over which the layer of SAUSG is deposited can be controlled to the point where a low deposition rate is achieved, thus avoiding problems of low yield due to high SAUSG deposition rates.

In sum, the above-indicated experiments lead to the following conclusions, partially supported by the graph shown in FIG. 1:

the deposition rate of TEOS based SAUSG is very sensitive to processing temperature poor contact between the wafer heating elements, such as the wafer heater and the wafer cover plate, results in lower processing temperatures a lower processing temperature during the deposition of a layer of SABPSG results in a faster deposition rate which results in poor gap fill capability which results in degradation of the initially deposited film of SABPSG, a higher processing temperature during the deposition of a layer SABPSG results in slower deposition rate of the layer of SABPSG, this slower deposition rate is essentially caused by desorption of deposition elements from the surface of the substrate due to the higher processing temperature the deposition rate of SABPSG remains essentially the same between a temperature of about 440 and 450 degrees C. due to the low desorption energy of the reactant species the decrease in deposition rate of SABPSG after the temperature exceeds about 450 degrees C. has been observed to be about 35.4 Angstrom/minute per degree of increase of temperature for reasons stated, the preferred rate of deposition of a layer of SABPSG is about 1,100 Angstrom/minute, which is achieved at about 480 degrees C. and no known method exists for the direct measurement of the degree and severity of warping of components, such as wafer heater and the wafer cover plate.

From the above the conclusion can be drawn that, by monitoring the deposition rate of a deposited layer of SABPSG, the actual temperature of the surface over which the SABPSG is deposited can be accurately monitored.

The invention can be reviewed and summarized as follows:

- the invention provides a method for monitoring wafer surface temperature during the deposition of a layer of sub-atmospheric tetra-ethyl-ortho-silicate-ozone BPSG (SABPSG)
- the invention uses a substrate processing tool for deposition of a layer of SABPSG, the substrate processing having been provided with a substrate heater and a substrate cover plate
- the substrate heater has a first spacing to the substrate
- the substrate cover plate has a second spacing to the substrate
- the substrate is positioned inside the substrate processing
- a temperature and first processing conditions are provided to the substrate processing for deposition of a layer of SABPSG
- a layer of SABPSG is deposited, and
- the deposition rate of the deposited layer of SABPSG is monitored across the surface of the substrate, the deposition rate has a target or desired deposition rate;
- the provided temperature is about 480 degrees C.
- temperature must be reduced for deposition rates exceeding a target or desired deposition rate
- temperature must be increased for deposition rates below a target or desired deposition rate
- the substrate heater is replaced for deposition rates exceeding a target or desired deposition rate
- the substrate cover plate is replaced for deposition rates exceeding a target or desired deposition rate
- the substrate heater and the substrate cover plate are replaced for deposition rates exceeding a target or desired deposition rate
- the first spacing is decreased for deposition rates exceeding a target or desired deposition rate
- the first spacing is increased for deposition rates below a target or desired deposition rate
- the second spacing is decreased for deposition rates exceeding a target or desired deposition rate, and
- the second spacing is increased for deposition rates below a target or desired deposition rate.

Further applicable to the invention are the following principles and conventions:

- an integrated circuit processing chamber is used, the processing chamber has been provided with a substrate heater having a first spacing to a monitor substrate in addition to a substrate cover plate having a second spacing to a monitor substrate
- a test layer comprising SABPSG is deposited on a monitor substrate
- deposition rates of the deposited layer of SABPSG are observed across the surface of said substrate
- at least one parameter affecting temperature is adjusted in the chamber, this adjusting is determined by a deposition rate of the deposited layer of SABPSG across the surface of said substrate
- monitoring the deposition rate of the deposited layer of SABPSG comprises viewing deposition rate of the deposited layer of SABPSG in a plurality of points across the monitor substrate
- adjusting at least parameter comprises providing a reference listing of a plurality of SABPSG deposition rates and a corresponding plurality of temperatures for depositing the layer of SABPSG under a first set of deposition conditions, finding the observed SABPSG deposition rate on the reference and determining the corresponding temperature adjustment from the reference and adjusting the temperature by replacing the substrate heater or the substrate cover plate or by adjusting the first spacing or by adjusting the second spacing, and
- the deposition of a test layer comprises methods of Chemical Vapor Deposition.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for monitoring wafer surface temperature during the deposition of a layer of sub-atmospheric tetra-ethyl-ortho-silicate-ozone BPSG (SABPSG), comprising the steps of:

providing a substrate;

providing a substrate processing tool for deposition of a layer of SABPSG, said substrate processing having been provided with a substrate heater and a-substrate cover plate, said substrate heater having a first spacing to said substrate, said substrate cover plate having a second spacing the said substrate;

positioning said substrate inside said substrate processing;

providing a temperature and first processing conditions to said substrate processing for deposition of a layer of SABPSG;

depositing a layer of SABPSG;

monitoring deposition rate of the deposited layer of SABPSG across the surface of said substrate, said deposition rate having a target deposition rate; and adjusting said deposition rate of the deposited layer of SABPSG.

2. The method of claim 1, said temperature being about 480 degrees C.

3. The method of claim 1, said adjusting said deposition rate of the deposited layer of SABPSG comprising:

adjusting said temperature;

replacing said substrate heater;

replacing said substrate cover plate;

replacing said substrate heater and said substrate cover plate adjusting said first spacing; and adjusting said second spacing.

4. The method of claim 3, said adjusting said temperature comprising reducing said temperature for deposition rates exceeding a target deposition rate.

5. The method of claim 3, said adjusting said temperature comprising increasing said temperature for deposition rates below a target deposition rate.

6. The method of claim 3, said replacing said substrate heater comprising replacing said substrate heater for deposition rates exceeding a target deposition rate.

7. The method of claim 3, said replacing said substrate cover plate comprising replacing said substrate cover plate for deposition rates exceeding a target deposition rate.

8. The method of claim 3, said replacing said substrate heater and said substrate cover plate comprising replacing said substrate heater and said substrate cover plate for deposition rates exceeding a target deposition rate.

9. The method of claim 3, said adjusting said first spacing comprising decreasing said first spacing for deposition rates exceeding a target deposition rate.

10. The method of claim 3, said adjusting said first spacing comprising increasing said first spacing for deposition rates below a target deposition rate.

11. The method of claim 3, said adjusting said second spacing comprising decreasing said second spacing for deposition rates exceeding a target deposition rate.

12. The method of claim 3, said adjusting said second spacing comprising increasing said second spacing for deposition rates below a target deposition rate.

13. A method of adjusting temperature control in a semiconductor integrated circuit processing chamber, comprising the steps of:

providing an integrated circuit processing chamber, said processing chamber having been provided with a substrate heater having a first spacing to a monitor substrate in addition to a substrate cover plate having a second spacing to a monitor substrate;

depositing a test layer on a monitor substrate within said chamber, said test layer comprising SABPSG;

observing deposition rates of the deposited layer of SABPSG across the surface of said substrate; and adjusting at least one parameter affecting temperature in the chamber, wherein adjusting is determined by a deposition rate of the deposited layer of SABPSG across the surface of said substrate.

14. The method of claim 13, said observing deposition rate of the deposited layer of SABPSG across the surface of said substrate comprising viewing deposition rate of the deposited layer of SABPSG in a plurality of points across the monitor substrate.

15. The method of claim 13, wherein depositing a test layer on a monitor substrate comprises depositing SABPSG under a first set of deposition conditions, and wherein adjusting at least one parameter comprises:

providing a reference listing of a plurality of SABPSG deposition rates and a corresponding plurality of temperatures for depositing the layer of SABPSG under a first set of deposition conditions;

finding the observed SABPSG deposition rate on the reference and determining the corresponding temperature adjustment from the reference; and adjusting the temperature by replacing said substrate heater.

16. The method of claim 13, wherein depositing a test layer on a monitor substrate comprises depositing SABPSG under a first set of deposition conditions, and wherein adjusting at least one parameter comprises:

providing a reference listing of a plurality of SABPSG deposition rates and a corresponding plurality of temperatures for depositing the layer of SABPSG under a first set of deposition conditions;

finding the observed SABPSG deposition rate on the reference and determining the corresponding temperature adjustment from the reference; and adjusting the temperature by replacing said substrate cover plate.

17. The method of claim 13, wherein depositing a test layer on a monitor substrate comprises depositing SABPSG under a first set of deposition conditions, and wherein adjusting at least one parameter comprises:

providing a reference listing of a plurality of SABPSG deposition rates and a corresponding plurality of temperatures for depositing the layer of SABPSG under a first set of deposition conditions;

finding the observed SABPSG deposition rate on the reference and determining the corresponding temperature adjustment from the reference; and adjusting the temperature by adjusting said first spacing.

18. The method of claim 13, wherein depositing a test layer on a monitor substrate comprises depositing SABPSG under a first set of deposition conditions, and wherein adjusting at least one parameter comprises:

providing a reference listing of a plurality of SABPSG deposition rates and a corresponding plurality of temperatures for depositing the layer of SABPSG under a first set of deposition conditions;

finding the observed SABPSG deposition rate on the reference and determining the corresponding temperature adjustment from the reference; and adjusting the temperature by adjusting said second spacing.

19. The method of claim 13, said depositing a test layer comprising methods of Chemical Vapor Deposition.

* * * * *